US006025725A

United States Patent [19]

Gershenfeld et al.

[11] Patent Number: 6,025,725

[45] Date of Patent: Feb. 15, 2000

[54] ELECTRICALLY ACTIVE RESONANT STRUCTURES FOR WIRELESS MONITORING AND CONTROL

[75] Inventors: Neil Gershenfeld, Somerville; Richard Fletcher, Cambridge, both of Mass.

[73] Assignee: Massachusetts Institute of Technology, Cambridge, Mass.

[21] Appl. No.: 08/984,929

[22] Filed: Dec. 4, 1997

Related U.S. Application Data

[60] Provisional application No. 60/033,236, Dec. 5, 1996.

[51] Int. Cl.$^{7}$ .................................................... G01R 27/00

[52] U.S. Cl. ............................................ 324/652; 324/653

[58] Field of Search .................................... 324/649, 652, 324/653, 655, 234, 236, 239; 361/268, 270; 363/20, 200, 207, 232; 331/65, 66; 340/572.5, 551; 29/25.42

[56] References Cited

U.S. PATENT DOCUMENTS

| | | | |
|---|---|---|---|
| 3,927,369 | 12/1975 | Billeter et al. | 324/642 |
| 3,958,450 | 5/1976 | Kleesattel | 73/573 |
| 4,063,229 | 12/1977 | Welsh et al. | 340/571 |
| 4,257,001 | 3/1981 | Partain et al. | 324/636 |
| 4,369,557 | 1/1983 | Vandebult | 29/25.42 |
| 4,494,841 | 1/1985 | Marcus | 396/207 |
| 4,529,961 | 7/1985 | Nishimura et al. | 340/447 |
| 4,623,835 | 11/1986 | Mehdizadeh et al. | 324/636 |
| 4,918,423 | 4/1990 | Fukuyama et al. | 340/442 |
| 4,942,766 | 7/1990 | Greenwood et al. | 73/704 |
| 4,990,891 | 2/1991 | Reeb | 340/572.5 |
| 5,260,665 | 11/1993 | Goldberg et al. | 324/636 |
| 5,334,941 | 8/1994 | King | 324/637 |
| 5,389,883 | 2/1995 | Harper | 324/636 |
| 5,420,518 | 5/1995 | Schafer, Jr. | 324/653 |
| 5,583,474 | 12/1996 | Mizoguchi et al. | 340/572.5 |
| 5,608,417 | 3/1997 | De Vall | 340/572.5 |

*Primary Examiner*—Diep N. Do

*Attorney, Agent, or Firm*—Cesari and McKenna, LLP

[57] ABSTRACT

A planar electromagnetic resonator utilizes an electromagnetically active material located between the capacitive or inductive elements of the resonator. A microscopic electrical property of this material is altered by an external condition, and that alteration, in turn, affects the behavior of the resonator in a consistent and predictable manner.

31 Claims, 5 Drawing Sheets

FIG. 7A
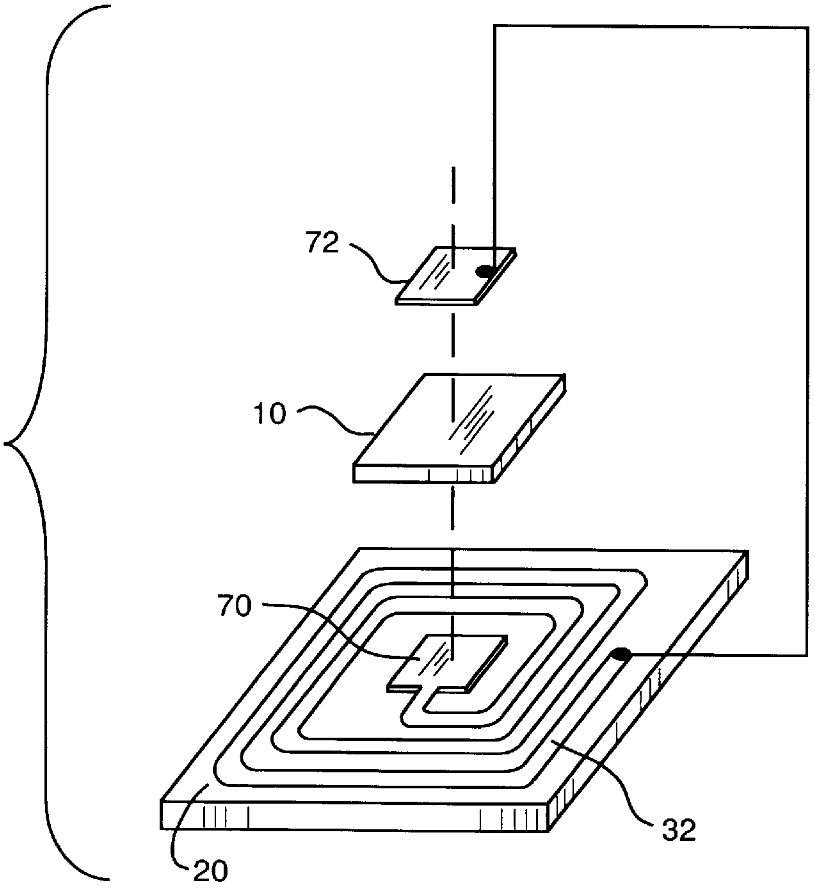
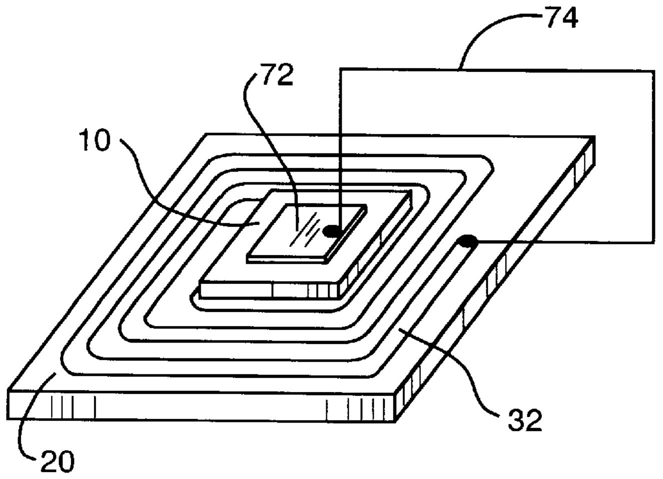
FIG. 7B

ELECTRICALLY ACTIVE RESONANT STRUCTURES FOR WIRELESS MONITORING AND CONTROL

RELATED APPLICATION

This application is based upon and claims priority from U.S. Provisional Application Ser. No. 60/033,236 (filed Dec. 5, 1996).

FIELD OF THE INVENTION

The present invention relates to remotely sensing and monitoring various conditions (such as force, temperature, humidity and/or light) to which people or objects are subject, and in particular to remote sensing using planar electromagnetic resonator packages.

BACKGROUND OF THE INVENTION

The ability to remotely sense parameters of interest in people and objects has long been desired. Presently, various monitoring technologies are known and used to sense conditions or to provide identification in a wide range of contexts. One such technology, known as "tagging," is commonly employed, for example, in shoplifting security systems, security-badge access systems and automatic sorting of clothes by commercial laundry services. Known tagging systems frequently use some form of radio-frequency identification (RF-ID). In such systems, RF-ID tags and a tag reader (or base station) are separated by a small distance to facilitate near-field electromagnetic coupling therebetween. Far-field radio tag devices are also known and used for tagging objects at larger distances (far-field meaning that the sensing distance is long as compared to the wavelength and size of the antenna involved).

The near-field coupling between the RF-ID tag and the tag reader is used to supply power to the RF-ID tag (so that the RF-ID tag does not require a local power source) and to communicate information to the tag reader via changes in the value of the tag's impedance; in particular, the impedance directly determines the reflected power signal received by the reader. The RF-ID tag incorporates an active switch, packaged as a small electronic chip, for encoding the information in the RF-ID tag and communicating this information via an impedance switching pattern. As a result, the RF-ID tag is not necessarily required to generate any transmitted signal.

Even though RF-ID tags have only a small and simple electronic chip and are relatively inexpensive, the solid-state circuitry is still relatively complex and vulnerable to failure. Another limitation of conventional monitoring techniques is the type of stimuli that can be sensed and the degree of sensing that can be performed. For instance, known LC-resonator sensing systems rely on macroscopic mechanical changes in the material structure, which indirectly leads to a change in the capacitance. For example, a foam-filled capacitor may be used to sense forces. As the capacitor is squeezed, its capacitance and, hence, the resonance frequency changes in response to the force. Such systems are not only relatively thick, but are also limited to sensing stimuli that affect the stress-strain curve of the dielectric. Also, the dynamic range of such systems is limited by the modulus of the dielectric; because of the difficulty in making extremely thin materials that can be squeezed, an effective lower limit is placed on the thickness of the capacitor. Accordingly, a need exists for an enhanced sensing system capable of monitoring a variety of stimuli (such as temperature, humidity and/or light) in addition to force.

BRIEF SUMMARY OF THE INVENTION

In accordance with the present invention, an LC resonator package contains an electrically active material. A microscopic electrical property of this material is altered by an external condition, and that alteration, in turn, affects the resonant frequency and/or harmonic spectra of the resonator in a consistent and predictable manner.

Accordingly, in one aspect of the invention, an LC resonator package may be provided to change its resonant frequency and/or harmonic spectra in response to a parameter or stimulus of interest. For example, the invention may be used to monitor or sense external conditions such as force, temperature, humidity and/or light.

In another aspect, the invention enhances the performance of an LC resonator for remote sensing and monitoring by utilizing within the resonator structure (e.g., as a dielectric), a material having an electrical property altered by an external condition. By incorporating such dielectric materials in the LC package itself, the capacitance and/or inductance (and, as a result, the resonant frequency, harmonic spectra and Q factor) is directly modified by the materials in response to an external condition. Examples of dielectric materials suitable for use in the present invention include piezoelectric materials (e.g., polyvinylidene difluoride in sheet form), ferroelectrics, magnetostrictive materials, and photoconductive polymers (e.g., polyphenyline vinyline).

In accordance with the invention, information about the monitored external condition is effectively encoded in an output characteristic of the resonator, and is extracted through measurement of this characteristic. Generally, the characteristics of greatest practical interest are the location of the center (resonant) frequency, the Q factor, and the harmonic spectrum generated by the package in response to an applied signal. These characteristics may be detected in a variety of ways, including measuring power reflected from the resonator (i.e., the loading or backscatter), measuring ringdown (i.e., decaying circulating power) following a signal pulse, and in the case of harmonics, sweeping a receiver through a range of frequencies to characterize a harmonic spectrum. It should be stressed that, although the resonators are shown as LC circuits, due to intrinsic material resisitance the behavior is actually that of an LRC circuit.

In a still further aspect, the invention utilizes a flat LC resonator package formed with at least two pancake spiral coils of conductive material respectively disposed on insulative layers. The flat package is inexpensively manufactured and amenable to unobtrusive placement in a wide variety of monitoring and control environments. Two or more spiral coils may be deposited onto a single insulative substrate, which is then folded over the electrically active dielectric. Using multiple pairs of coils each folded over a separate dielectric sheet, it is possible to obtain increased signal strength and relatively low resonant frequencies (e.g., less than 10 MHz).

In yet another aspect, the invention may utilize two or more LC resonators on the same structure to monitor various conditions in the same environment. To differentiate between the various conditions, each resonator may be associated with a unique resonant frequency, Q factor or harmonic spectrum so the response of each resonator can be accurately and separately monitored. Similarly, differently characterized resonators responsive to the same condition can be associated with different items of interest (e.g., semiconductor chips or other electronic components, or different regions of a chassis) and addressed separately. Indeed, even similarly characterized resonators can be used to monitor physically dispersed items or spatial regions using multiple sensing antennas with knowledge of the distribution geometry (or, alternatively, multiple antennas having known spatial locations can be used to deduce the locations of a known number of similarly characterized resonators).

In still another aspect, differently characterized (and therefore independently addressable) resonators are used to encode binary information. For example, if each of a series of resonators has a different, known resonant frequency, a binary pattern can be encoded through selective activation of the resonators and queried using a frequency-agile generator (or variable-frequency generator). In a more elaborate variation to this approach, the resonators are not isolated and addressed separately, but instead are allowed to interact in a nonlinear fashion; this coupling interaction can produce additional frequency-domain and time-domain signatures, providing a further degree of freedom in which to encode information and facilitating simultaneous detection of multiple bits of information.

The invention may be used in a variety of practical applications including, for example, temperature monitoring of chips or other electronic components, measurement of skin or wound temperature with the invention embedded in a bandage, use as a wireless computer input device, use as a wireless force sensor, or in a seat that determines occupant presence and position.

BRIEF DESCRIPTION OF THE DRAWINGS

The foregoing discussion will be understood more readily from the following detailed description of the invention, when taken in conjunction with the accompanying drawings, in which:

FIGS. 7*a* and 7*b* illustrate two views for a configuration of the LC resonator package in an embodiment of the present invention suitable for applications (e.g., humidity sensing) involving environmental exposure.

DETAILED DESCRIPTION OF THE PREFERRED EMBODIMENTS

Figure 1A:
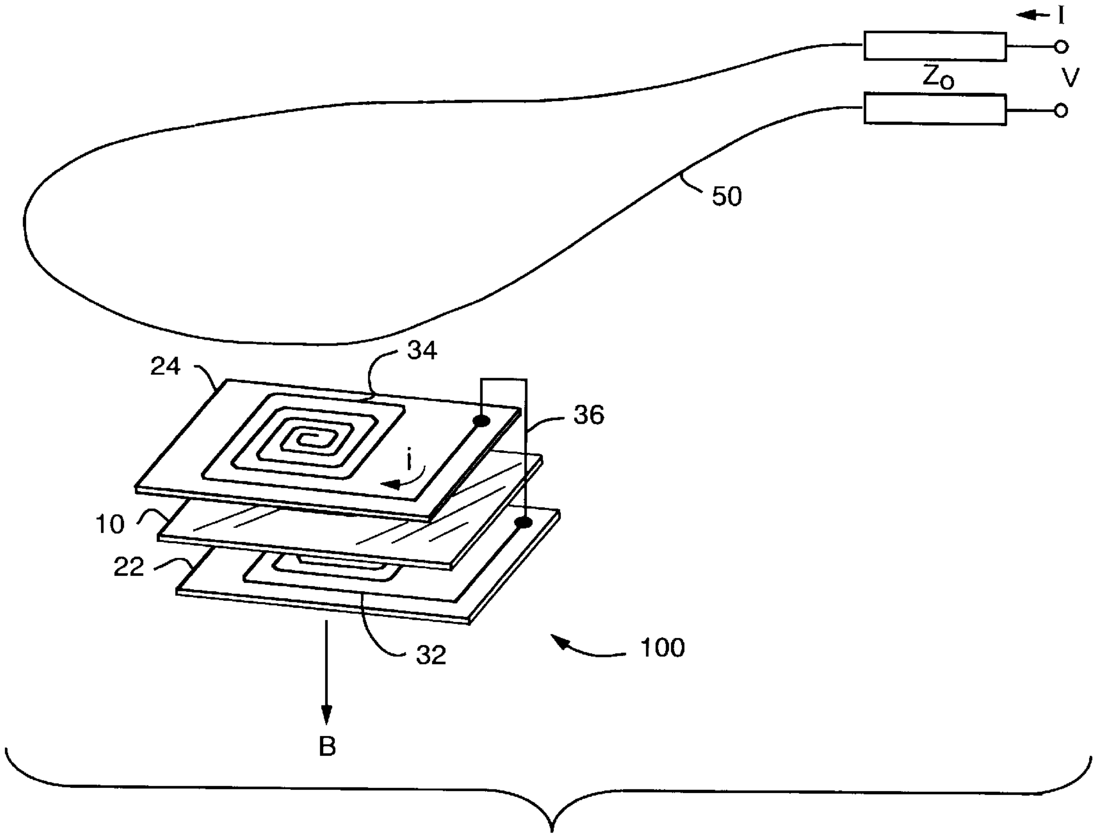
FIG. 1A generally illustrates the wireless sensing environment for an LC resonator package according to an embodiment of the present invention using a single-port measurement arrangement.
Figure 1B:
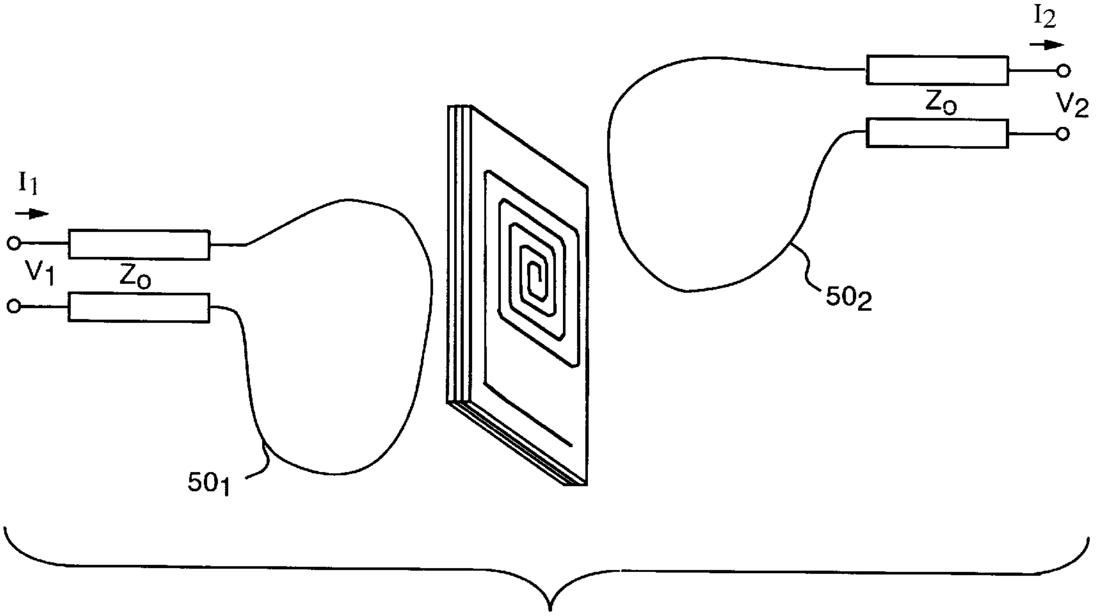
FIG. 1B illustrates a two-port measurement arrangement for the LC resonator package shown in FIG. 1A.
Figure 2A:
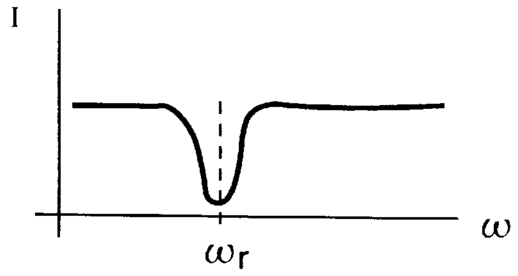
FIG. 2A is a graph of the output current signal as a function of frequency for an LC resonator package according to the embodiment of the invention shown in FIG. 1A, using an untuned antenna coil.

A generalized circuit illustrating an LC resonator package according to an embodiment of the present invention, as well as monitoring circuitry therefor, is shown in FIGS. 1A and 1B. In FIG. 1A, an LC resonator package 100 is encompassed by an interrogation coil 50. A continuous-wave ac input signal may then be applied to the interrogation coil 50 at an input port V, via a transmission line having an impedance $Z_0$, by a conventional sweep generator or the like (not shown). The LC resonator package 100 placed within the range of interrogation coil 50 changes the reflected power returning to the input port V—that is, the loading (at near-field coupling distances) or backscatter (for far-field coupling). The maximum operating distance between the resonator package and the interrogation antenna is approximately twice the maximum dimension of the interrogation antenna. As shown in FIG. 2A, the reflected power reaches a minimum at $\omega=\omega_0$, i.e., the resonant frequency.

Figure 2B:
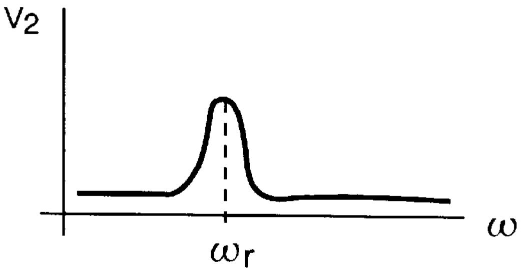
FIG. 2B is a graph of the output voltage signal as a function of frequency for an LC resonator package according to the embodiment of the invention shown in FIG. 1B, again using an untuned antenna coil (and assuming low coupling between the two antennas)

The two-port configuration shown in FIG. 1B employs a transmitting coil $\mathbf{50}_1$ and a receiving coil $\mathbf{50}_2$. The LC resonator package 100 changes the transmitted power from coil $\mathbf{50}_1$ to coil $\mathbf{50}_2$. If the coupling between transmitting and receiving coils is low, the transmitted voltage will have a maximum at the resonant frequency as shown in FIG. 2B.

Figure 3:
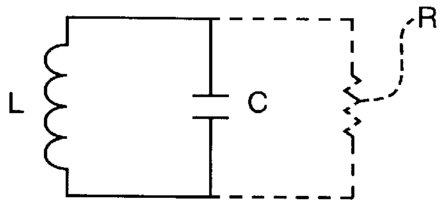
FIG. 3 schematically illustrates the LC resonator circuit according to an embodiment of the present invention.

Either of the illustrated configurations can be operated to locate the resonant frequency of the package 100, which, as shown in FIG. 3, may be represented as an inductive-capacitive (LC) tank circuit having an inductor L and a capacitor C, and an intrinsic material resistance R. As explained below, shifts in this frequency can be exploited to quantify (and thereby monitor) a parameter of interest affecting this resonator characteristic; additionally, resonators having different resonant frequencies can be distinguished on this basis. It is also possible to use the quality factor (Q) as a measurement characteristic, but the resonant frequency is preferred because it is less affected by factors such as resistive loss and antenna loading. Typically, the output signal (i.e., the current I in the configuration shown in FIG. 1A or the voltage $V_2$ in the configuration shown in FIG. 1B) is fed to a computer or a signal-processing device, which analyzes the signal as a function of applied frequency.

Alternatively, the degree of damping can be used to characterize a parameter of interest affecting this resonator characteristic, or to distinguish among differently characterized resonators. Since the resonator 100 has the ability to store energy, it will continue to produce a signal after the excitation field has been turned off (again, due to internal resistance, the resonator 100 behaves as an LRC circuit). Most surrounding environments do not possess a significant Q, and as a result, the only signal remaining after an excitation pulse will be the signal from the resonator itself. Either of the configurations shown in FIGS. 1A and 1B can be operated to detect damping in this manner. An excitation signal in the form of an rf burst is applied to coil 50 or coil $\mathbf{50}_1$, and the ringing of the resonator—which reflects damping—is sensed between bursts by coil 50 or coil $\mathbf{50}_2$. More specifically, the amount of power transferred to the resonator from an rf burst of known duration is computed; and during the ringdown phase, the amount of power transferred to coil 50 or $\mathbf{50}_2$ is measured and compared with the power transferred to resonator 100.

In another alternative, the electrical characteristic used to identify a resonator or to characterize a parameter of interest is the resonator's harmonic spectra In response to an excitation signal of a particular frequency, the resonator 100 generates harmonics—that is, a spectrum of multiples of the excitation frequency. The character of the harmonic spectrum (i.e., the envelope of harmonic frequencies generated and their amplitudes) depends on the nonlinear response properties of the resonator 100. The harmonic spectrum for a particular excitation frequency is obtained by applying a continuous signal at that frequency through transmitting coil $\mathbf{50}_1$, and sensing amplitude over a band of frequencies at the receiving coil $\mathbf{50}_2$. Thus, instead of sweeping through transmitted frequencies to locate a resonant frequency, as discussed above, the receiver sweeps through a range of frequencies greater than and less than that of the applied signal to characterize the harmonic spectrum for the applied signal frequency. As described below, the harmonic spectrum can represent a fixed characteristic of the resonator 100 (for purposes of identification), or can instead vary with an external condition of interest to facilitate characterization of that condition.

With renewed reference to FIG. 1A, the LC resonator package 100 includes an electrically active dielectric material 10 separating a pair of electrically insulative substrates 22, 24. A coil 32, 34 is formed on the top surface of each of the substrates 22, 24, which face each other and are separated by the dielectric material 10. The coils 32, 34 are pancake spirals in this embodiment and may be formed of a conductive metal (e.g., by conventional foil etching or stamping techniques). The helicities of the spirals are disposed opposite one another so the current flows counter clockwise as shown by the arrow i under the influence of a magnetic field flowing out of the top surface 24 as represented by the arrow B. The coils 32 and 34 are connected by a connector 36 in this embodiment.

Figure 4:
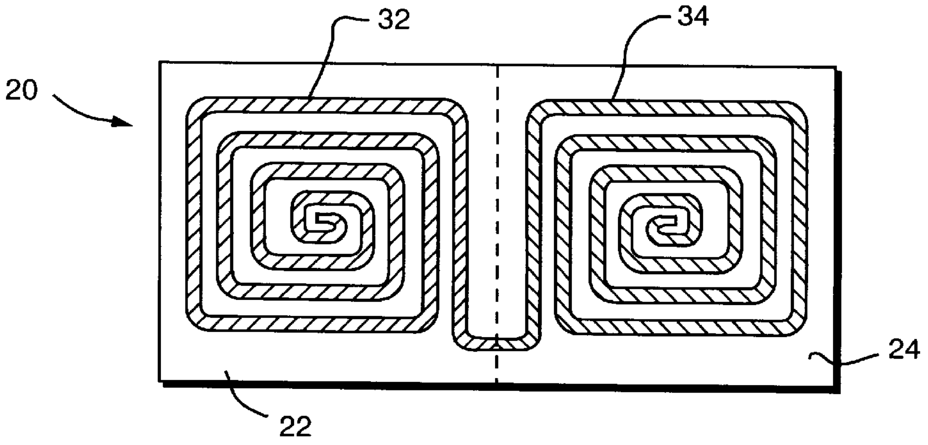
FIG. 4 illustrates a conductor geometry for an LC resonator package in an embodiment of the present invention.
Figure 5:
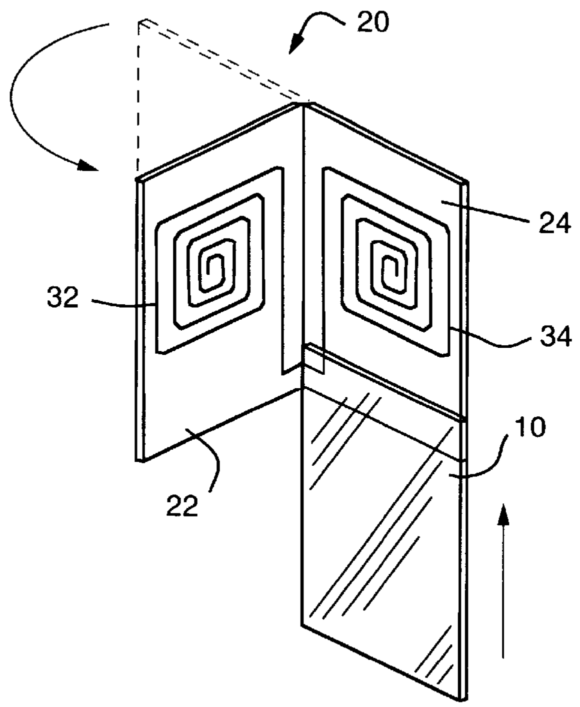
FIG. 5 illustrates forming an LC resonator package for an embodiment of the present invention which utilizes a pair of elements.

The resonators of the present invention can be constructed in a variety of configurations, depending on the application, the desired output signal strength, the location of the resonant frequency, etc. In the simplest embodiment, shown in FIG. 1, the the resonator 100 is a sandwich of three separate sheets 10, 22, 24 with appropriate connection between the coils 32, 34. For ease of manufacture, however, an approach such as that shown in FIG. 4 is preferred, where a pair of connected coils of opposite helicities is deposited onto a single sheet of substrate material. As shown in FIG. 5, by folding the material over dielectric material 10 (along the dashed line appearing in FIG. 4), the two substrates 22, 24 are formed so as to enclose the dielectric material 10.

Figure 6:
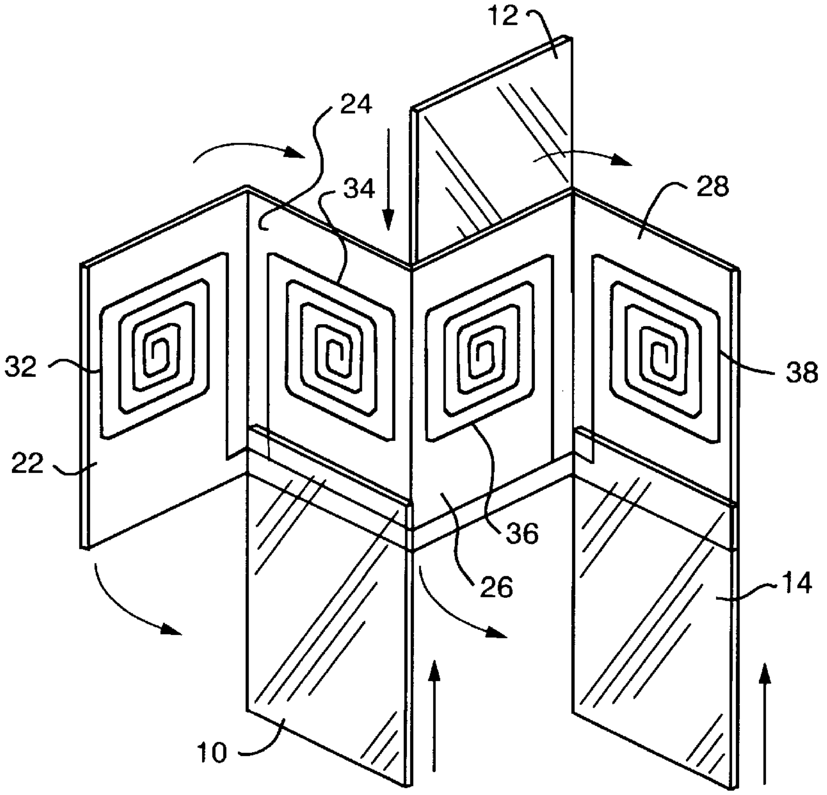
FIG. 6 illustrates an unfolded an LC resonator package according to an embodiment of the present invention which utilizes four elements.

The resonant frequency range of the LC resonator may be conveniently varied, for example, through the number of coil turns. Thus, in another embodiment of the present invention illustrated in FIG. 6, four spiral coils 32, 34, 36 and 38 are formed on respective portions 22, 24, 26 and 28 of the substrate 20. When the substrate 20 is folded as shown, three dielectric materials 10, 12 and 14 are disposed between the respective substrate portions. This configuration effectively increases the number of coil turns, producing a lower resonant frequency as well as increased signal strength. Lower frequencies may be preferred for immunity to parasitic effects and increased ability to penetrate intervening material, while higher frequencies enhance measurement accuracy; typical frequencies may range from 1–100 MHz, but are desirably below 25 MHz.

The applications of the LC resonator package according to the present invention are wide-ranging. By selecting a condition-sensitive material and integrating this into the the LC resonator package 100 to render it responsive to the external condition to be sensed, variation of that condition will quantitatively shift the resonant frequency, or alter the harmonic spectrum (at a given excitation frequency) or the Q factor; this variation is sensed as described above, and the results interpreted to measure (or measure changes in) the external condition.

Accordingly, in one approach, dielectric material 10 at least partially contains (or is at least partially formed of) a material having an electrical property altered by an external condition, thereby altering the resonant frequency or harmonic spectrum of the LC resonator package 100. Examples of the dielectric material 10 that may be used include polyvinylidene difluoride (PVDF) in sheet form, other piezoelectric or pyroelectric polymers, piezoelectric ceramics and photoconductive polymers. The dielectric material 10 may contain areas of the electrically active dielectric material and areas of conventional dielectric material. The relative amount of each material and their respective placements represent design parameters determined by the specific application.

Alternatively, the harmonic spectrum of the resonator 100 can be altered through the incorporation of, for example, ferroelectric materials (such as PVDF, lead-zirconium-titanate compounds and strontium titanate) into the structure. Thus, the use of PVDF as the dielectric 10 results in variation of the resonator's harmonic spectra as well as its resonant frequency and Q factor.

In another alternative, the condition-sensitive material is used to form coils 32, 34. For example, materials with magnetic permeabilities that vary in response to an external condition alter the inductance of the coils and, hence, the resonant frequency and Q of the resonator 100. In a manner analogous to piezoelectrics, magnetostrictive materials (including iron-nickel compounds such as Permalloy and iron-nickel-cobalt compounds) have magnetic permeabilities that change in response to an applied force. It is also possible to use magnetostrictive materials in sheet form to "load" coils 32, 34 by locating the material above the coil or between substrates 22, 24 and dielectric 10. It is also possible to form coils 32, 34 from a conductive (e.g., pigment-loaded) polymer exhibiting sensitivity to an external condition. Once again, the effect would be to alter the electrical characteristics of resonator 100.

To return to an earlier example, using a piezoelectric material as the dielectric 10, variation in the piezoelectric response (e.g., due to application of a force) alters the charge leakage between the plates of the capacitor formed by coils 32, 34; this, in turn, alters the capacitance and, therefore, the resonant frequency and Q factor of the resonator. PVDF also exhibits pyroelectric and hygroscopic properties, altering its electrical properties in response to changes temperature and changes in ambient humidity.

For force and/or temperature sensing, the LC resonator package is typically sealed along the edges so that the dielectric (or other condition-sensitive) material is not exposed. However, when sensing humidity or in temperature-sensing applications where direct contact between the condition-sensitive material and the environment is necessary, one surface of the material may be exposed as illustrated in FIGS. 7A and 7B. As shown therein, a substrate 20 has a spiral coil 32 disposed thereon in the manner of the previously described embodiments. However, the spiral coil 32 has a solid, button-like area 70 of conductive material connected to the inner terminus thereof. The condition-sensitive dielectric material 10 is then disposed on top of this single spiral coil 32 and substrate 20. Next, a second solid area 72 of conductive material is disposed on the dielectric material 10, which is positioned such that the solid area 70 opposes the solid area 72; solid area 72 is electrically connected to the outermost loop of the spiral coil 32 by a conductor 74. Accordingly, dielectric material 10 is directly exposed to environmental conditions, and the LC resonator package as illustrated in FIGS. 7A and 7B may sense conditions of objects or environments relating to humidity or temperature.

Alternatively, the dielectric material 10 may be exposed to external environmental conditions by means of perforations through sheets 22 and/or 24, or through coils 32 and/or 34, or through both the sheets and the coils.

Thus, a temperature-responsive resonator in accordance with the invention may be used, for example, to monitor the temperature of a semiconductor chip (e.g., to detect if the temperature of the chip has exceeded a predetermined threshold). This may be accomplished without any extra leads to the chip. In another example, the present invention may be used as a wireless sensor in a bandage that monitors the temperature and humidity of a wound.

To appreciate the utility of the present invention in force-sensing applications, it is useful to model the response of a resonator constructed as shown in FIGS. 1A and 1B, but containing a conventional high-frequency dielectric (such as clear TEFLON in sheet form). The structure can be accurately represented as a simple LRC circuit including an inductor, resistor and plate capacitor with a dielectric material. By applying an elastic model to the deformation of the dielectric material under applied stress, the resonant frequency of the tag can be derived as a function of applied stress:

$$\omega_n = \omega_{n_0} \cdot \sqrt{\frac{E - \sigma}{E}}$$

where $\omega_{n_0}$ is the resonant frequency of the tag absent any applied stress, E is the Young's Modulus of the dielectric material, and a is the applied stress. Rearranging this equation yields an expression relating the ratio of the change of resonant frequency versus initial resonant frequency and the induced strain, $\epsilon$, in the dielectric material:

$$\frac{\Delta\omega}{\omega_{n_0}} = 1 - \sqrt{1 - \varepsilon}$$

Figure 8:
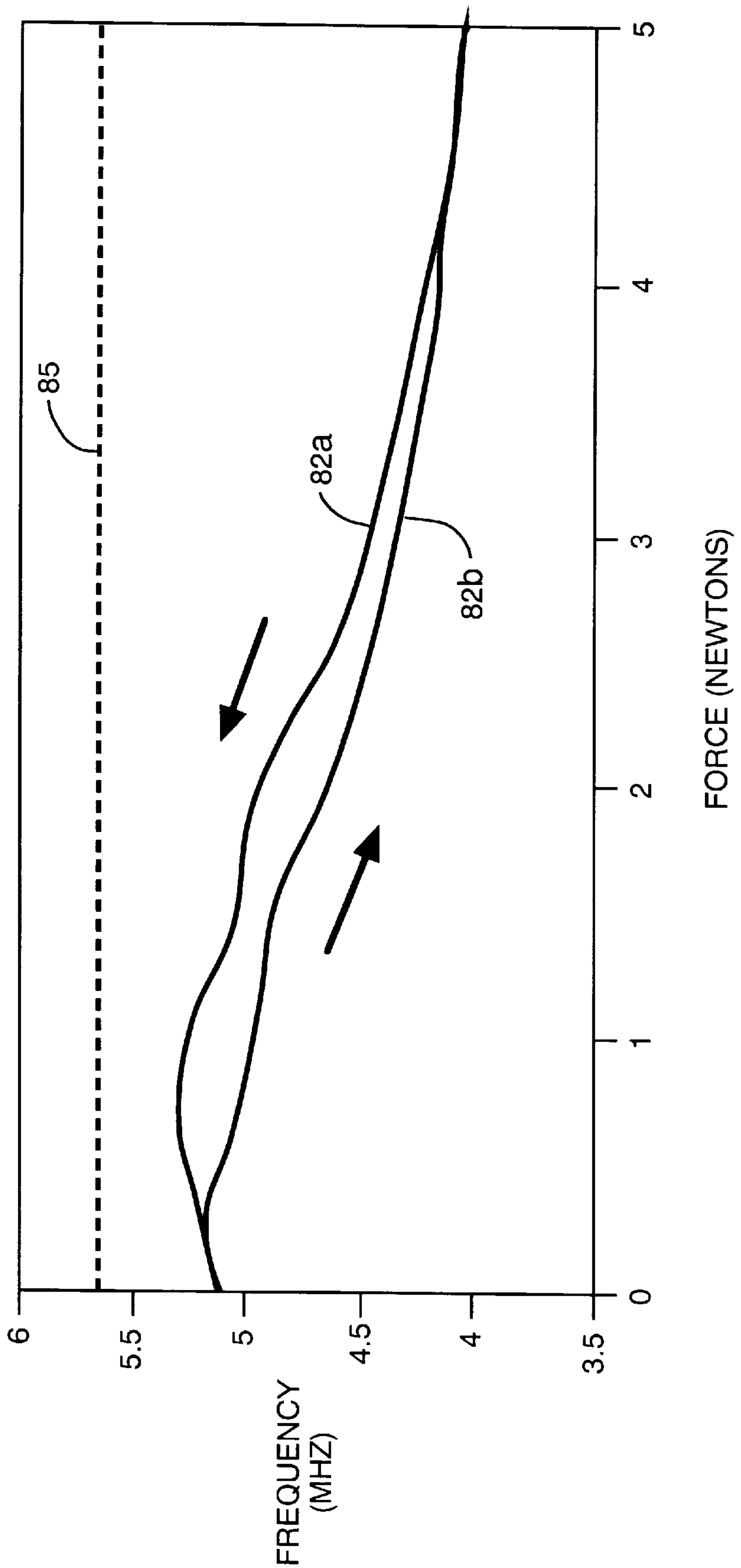
FIG. 8 is a sample graph showing the response of the invention employed as a force sensor and, for comparative purposes, an identically constructed sensor utilizing a piezoelectrically inactive dielectric material.

The measured data and the curve predicted by this model is included in FIG. 8 (discussed below) and very closely matched the measured data to within 0.1%. On this frequency scale, the change in resonant frequency appears as a flat line.

In comparing the TEFLON response to the response produced using PVDF, this model indicates that in a typical dielectric material with Young's Modulus of about 3 GPa (comparable to PVDF and clear TEFLON sheet), a 10% change in frequency would occur in response to a strain of 19%. In order to produce in a 10% change in the resonant frequency of the structure, an applied force of 60,000 Newtons would be required (assuming a linear strain model with no yielding). On the other hand, the resonator incorporating the piezoelectric material shows a significant response with an applied force of as little as 0.1 Newtons. A theoretical curve (not including hysteresis) could be derived for the piezoelectric response by solving the coupled tensor equations:

$$\epsilon E = \epsilon_T E + dT$$

$$S = dE + s^E T$$

where E is the electric field, T is the mechanical stress, d is the piezoelectric coefficient, $\epsilon$ is the complex permittivity at zero stress, and $s^E$ is the mechanical compliance at zero field.

A preferred force sensor package utilizes the general configuration indicated at 20 in FIG. 5, but the inner termini of the coils 32, 34 may be enlarged into solid, button-like areas (as shown in FIGS. 7A and 7B). Because the microscopic properties of the material itself are sensed, the LC resonator package can be made to be very thin and flexible, and may also be sealed at the edges. As shown in FIG. 8, this construction exhibits a logarithmic response and is capable of resolving very small forces or small changes (tens of milli-Newtons). In particular, the essentially straight-line graph 85, which depicts the behavior under force of a structure containing TEFLON as the dielectric 10, demonstrates that conventional dielectric materials are essentially unresponsive to small forces or changes in applied force. Curves 82*a*, 82*b* illustrate the behavior of an identical package using PVDF as the dielectric 10. Although the behavior includes some hysteresis with respect to the applied force, the hysteresis and linearity can be improved greatly through proper packaging of the sensor elements in order to provide a pre-stress on the dielectric and limit the maximum stress tranmsitted to the dielectric. Responses to larger forces can be accurately sensed by using, for example, ceramic piezoelectric materials, which generaly have a higher modulus and larger operating stress range than polymer piezoelectric materials.

Force-sensing applications can include force measurement (e.g., function as a very small, wireless weight scale) or, less precisely, to detect the presence and/or position of an object or person. For example, a single force sensor in accordance with the invention can be associated with a seat, and register the presence of a person occupying the seat; by distributing multiple, independently addressable sensors in different parts of the seat, the occupant's position within the seat may be resolved.

Using a photoconductive polymer as the dielectric 10 and at least one transparent substrate 22 and/or 24, the invention may be used to sense and measure light of a desired wavelength or wavelength range. Suitable photoconductive materials include polyphenyline vinyline; others are well known in the art, and are straightforwardly employed as discussed above. When an optically sensitive element in accordance with the present invention incorporates an optical filter, it can function, for example, as an infrared sensor. Such a device would convert an infrared signal to a radio-frequency signal, and may be used, e.g., as a modem to link IRDA devices to RF devices.

Multiple separate resonator elements for use in the same environment may be incorporated on a single board or chassis as separately addressable packages. Although it is possible to boost signal response by simultaneously addressing multiple identical resonators each conveying the same information, ordinarily each of the resonator elements will be separately addressable. Multiple resonators, each having a different resonant frequency, require adequate bandwidth separation to permit resolution and prevent unwanted interaction. Each resonator has a frequency bandwidth of approximately $\omega_r/Q$. As a result, the number of elements in a single system is limited to $BQ/\omega_r$, where B is the total frequency bandwidth over which a particular reader or system may operate. More generally, the primary factors limiting the number of resonances are the available bandwidth of the reader, its frequency resolution, the Q factor of the resonances, the physical sizes of the individual elements, and the desired read range.

It is also possible to utilize the resonators of the present invention for identification purposes; for example, a single resonator element having a unique resonant frequency may be integral with an item to serve as a "tag." Alternatively, if a large number of unique identifiers is required, each tag may consist of a plurality of resonator elements each having a separate resonant frequency. Indeed, in this way, the resonators of the present invention can be used for purposes of information storage. For example, each separate frequency bin $\omega_r/Q$ may be treated as a binary digit. With all possible resonant frequencies known in advance, a frequency sweep reveals a series of binary digits by the presence or absence of a detected resonance at each of the possible frequencies. That is, given N possible resonant frequencies per tag, it is possible to create $2^N-1$ different tags.

To expand the amount of information that may be conveyed by a given series of tags, the tag signals can be considered in the time domain as well as in the frequency domain—that is, the signal is examined as a function of time as well as frequency. This additional degree of information can be implemented by changing the coupling between different resonators. (This obviously applies only to applications involving more than a single resonator element.) Nonlinear coupling permits the resonator signals to interfere and "beat" with each other, and can be varied by controlling the spacing between elements or how they overlap. The time-domain modulation signal can then be read using, for example, an envelope detector.

Although resonator orientation is most straightforwardly determined by signal strength and, possibly, phase measured at multiple locations, it may also be possible to utilize nonlinear time-domain signals and signal interactions to resolve the orientation of one resonator, or the relative orientations among a plurality of resonators whose signals interact. In the single-resonator case, the observed signal falls off with distance, but is also a function of relative orientation with respect to the detector. By making a sufficient number of signal measurements at a variety of known locations, it is possible to unambiguously resolve orientation (i.e., to separate it from distance dependence).

In the case of multiple resonators, measuring the time dependence of the frequency spectrum (i.e., the energy at each frequency as a function of time) provides information about the manner in which the resonator signals are coupled, and therefore how the resonators are spatially disposed relative to one another. Once again, by utilizing a sufficient number of measurements and knowledge of the location of one or more of the resonators, it is possible to overdetermine orientation parameters so as to permit their resolution.

The geometry of the resonator can also be relevant to its behavior, particularly at s high applied frequencies, and may be exploited for purposes of identification or sensing.

While the present invention has been described and illustrated in terms of preferred embodiments thereof, the present invention should not be limited to these embodiments. Various changes and modifications could be made by those skilled in the art without departing from the scope of the invention as set forth in the attached claims.

What is claimed is:

1. A device for remote sensing comprising an inductor and a capacitor connected to form an electrical circuit having a resonant frequency, the capacitor comprising a pair of conductors separated by a dielectric, the device comprising a material having an intrinsic electrical property altered by an external condition, alteration of the electrical property remotely detectably varying at least one characteristic of the circuit selected from resonant frequency, harmonic spectra and Q factor.

2. The device of claim 1 wherein the external condition is at least one of (a) applied force, (b) temperature, (c) humidity, and (d) light.

3. The device of claim 1 wherein the material having an intrinsic electrical property is also the dielectric.

4. The device of claim 3 wherein the intrinsic electrical property is charge leakage.

5. The device of claim 3 wherein the material is polyvinylidene difluoride in sheet form.

6. The device of claim 3 wherein the material is a piezoelectric ceramic.

7. The device of claim 3 wherein the material is a photoconductive polymer.

8. The device of claim 3 wherein the material is magnetostrictive.

9. The device of claim 3 wherein the material is ferroelectric.

10. The device of claim 1 wherein the material having an intrinsic electrical property is also the inductor.

11. The device of claim 10 wherein the intrinsic electrical property is magnetic permeability.

12. The device of claim 1 wherein the inductor comprises at least two pancake spirals of conductive material each disposed on an insulative sheet, the spirals having outermost loops electrically connected to one another, the spirals being disposed opposite one another to also serve as plates forming the capacitor, and the dielectric material being located between the spirals.

13. The device of claim 12 wherein the spirals are located on the same insulative sheet in spaced-apart relation to one another, the spirals being disposed opposite one another by folding of the sheet.

14. The device of claim 12 wherein the spirals each comprise an inner terminus, the inner terminus of at least one of the spirals comprising a solid area of conductive material.

15. The device of claim 3 wherein the dielectric material is sealed between the conductors.

16. The device of claim 3 wherein at least a portion of the dielectric material is at least partially exposed.

17. A method of sensing an external condition, the method comprising:

a. providing a device for remote sensing comprising an inductor and a capacitor connected to form an electrical circuit having a resonant frequency, the capacitor comprising a pair of conductors separated by a dielectric, the device comprising a material having an intrinsic electrical property altered by an external condition, alteration of the electrical property remotely detectably varying at least one characteristic of the circuit selected from resonant frequency, harmonic spectra and Q factor;

b. exposing the device to the external condition;

c. wirelessly measuring the characteristic; and d. based on the measured characteristic, determining the external condition.

18. The method of claim 17 wherein the measurement is a time-domain measurement.

19. The method of claim 17 wherein the measurement is a frequency-domain measurement.

20. The method of claim 17 wherein the external condition is at least one of (a) applied force, (b) temperature, (c) humidity, (d) light.

21. The method of claim 17 wherein the wireless measurement step comprises applying a signal to the device and measuring power reflected from the package.

22. The method of claim 17 wherein the wireless measurement step comprises applying a signal to the device from a transmit antenna and measuring power received by a receive antenna.

23. The method of claim 17 wherein the wireless measurement step comprises applying a signal pulse to the device and, after the pulse, measuring ringdown from the device.

24. The method of claim 17 wherein the wireless measurement step comprises applying a signal to the device and measuring a resulting harmonic spectrum.

25. The method of claim 17 further comprising the step of providing first and second device each comprising a pair of conductors separated by a dielectric, each device comprising a material having an intrinsic electrical property altered by an external condition, alteration of the electrical property remotely detectably varying at least one characteristic of the circuit selected from resonant frequency, harmonic spectra and Q factor, the variation differing between the devices, and further comprising the steps of:

a. simultaneously wirelessly measuring at least one characteristic of the first and second circuits selected from resonant frequency, harmonic spectra and Q factor; and b. based on the measured characteristic, determining the external condition relative to the first and second circuits.

26. The method of claim 17 wherein the characteristic is resonant frequency.

27. The method of claim 17 wherein the characteristic is Q factor.

28. The method of claim 17 wherein the characteristic is harmonic spectra.

29. A method of determining location comprising the steps of:

a. providing a plurality of devices, each device comprising a coil and a capacitor forming a circuit having a resonant frequency;

b. electrically exciting the devices to produce interacting electrical signals;

c. sensing the signals as a function of time; and d. based thereon, determining a location of at least one of the devices.

30. The method of claim 29 wherein the sensing step comprises measuring nonlinear time-domain signals and signal interactions.

31. The method of claim 29 wherein the sensing step comprising measuring energy at a plurality of frequencies as a function of time.

* * * * *